United States Patent
Akenine-Moller

(10) Patent No.: US 12,413,749 B2
(45) Date of Patent: Sep. 9, 2025

(54) EXPLOITING REDUNDANT BIT COMBINATIONS IN A COMPRESSED REPRESENTATION OF AN IMAGE

(71) Applicant: NVIDIA Corporation, Santa Clara, CA (US)

(72) Inventor: Tomas Akenine-Moller, Lund (SE)

(73) Assignee: NVIDIA CORPORATION, Santa Clara, CA (US)

( * ) Notice: Subject to any disclaimer, the term of this patent is extended or adjusted under 35 U.S.C. 154(b) by 249 days.

(21) Appl. No.: 17/987,510

(22) Filed: Nov. 15, 2022

(65) Prior Publication Data

US 2024/0022736 A1  Jan. 18, 2024

Related U.S. Application Data

(60) Provisional application No. 63/389,328, filed on Jul. 14, 2022.

(51) Int. Cl.
| | | |
|---|---|---|
| *H04N 19/176* | (2014.01) | |
| *G06T 9/00* | (2006.01) | |
| *H03M 7/30* | (2006.01) | |
| *H04N 19/65* | (2014.01) | |

(52) U.S. Cl.
CPC ............ *H04N 19/176* (2014.11); *G06T 9/00* (2013.01); *H03M 7/6041* (2013.01); *H03M 7/6094* (2013.01); *H04N 19/65* (2014.11)

(58) Field of Classification Search
CPC ..... G06T 9/00; H03M 7/6041; H03M 7/6094; H04N 19/176; H04N 19/65
USPC ........................................................ 375/240
See application file for complete search history.

(56) References Cited

U.S. PATENT DOCUMENTS

| | | | |
|---|---|---|---|
| 5,956,431 | A | 9/1999 | Tourcha et al. |
| 7,551,630 | B2 | 6/2009 | De Boeck |
| 8,644,627 | B2 * | 2/2014 | Akenine-Moller ....... G06T 9/00 382/162 |
| 10,798,418 | B2 * | 10/2020 | Edpalm .................. H04N 23/80 |
| 11,153,578 | B2 * | 10/2021 | Patel ...................... H04N 19/59 |

(Continued)

OTHER PUBLICATIONS

Akenine-Moller et al., "Real-Time Rendering, Fourth Edition," CRC Press, 2018, 1199 pages.

(Continued)

*Primary Examiner* — William C Vaughn, Jr.
*Assistant Examiner* — Astewaye Gettu Zewede
(74) *Attorney, Agent, or Firm* — Zilka-Kotab, P.C.

(57) ABSTRACT

Block compression schemes used for image compression are susceptible to generating image blocks having redundant bit sets (i.e. a redundant bit combination), where one of the bit sets in the block is not meaningfully different from the other bit set in the block. As a result, one of the bit sets will be meaningless to a decompression scheme used to decompress the image and thus will not contribute to improving a quality of the decompressed image. The present disclosure provides a technique to exploit redundant bit combinations in a compressed representation of an image, including to exploit more than just the simple case of bit sets that are identical. Exploiting a redundant bit combination will allow an otherwise meaningless bit set to be used for some other discriminating purpose, which can allow for a higher image quality after decompression.

31 Claims, 8 Drawing Sheets

(56) References Cited

U.S. PATENT DOCUMENTS

| | | | | |
|---|---|---|---|---|
| 2004/0247192 | A1* | 12/2004 | Kajiki | G06K 9/36 |
| | | | | 382/239 |
| 2008/0310740 | A1* | 12/2008 | Strom | H04N 19/91 |
| | | | | 382/233 |
| 2009/0160857 | A1* | 6/2009 | Rasmusson | G06T 15/04 |
| | | | | 345/422 |
| 2019/0304138 | A1* | 10/2019 | Fuller | G06T 9/002 |
| 2021/0398247 | A1* | 12/2021 | Kokura | G06T 3/4015 |
| 2022/0201302 | A1* | 6/2022 | Webb | H04N 19/176 |
| 2022/0394264 | A1* | 12/2022 | Li | H04N 19/124 |

OTHER PUBLICATIONS

Strom et al., "iPACKMAN: High-Quality, Low-Complexity Texture Compression for Mobile Phones," Graphics Hardware, 2005, 9 pages.

Strom et al., "ETC2: Texture Compression using Invalid Combinations," Graphics Hardware, 2007, 7 pages.

Beers et al., "Rendering from Compressed Textures," Proceedings of the 23rd annual conference on Computer graphics and interactive techniques, Aug. 1996, 4 pages, retrieved from https://dl.acm.org/doi/10.1145/237170.237276.

Campbell et al., "Two Bit/Pixel Full Color Encoding," Proceedings of ACM SIGGRAPH, vol. 20, Aug. 1986, pp. 215-223.

Delp et al., "Image Compression Using Block Truncation Coding," IEEE Transactions on Communications, vol. 27, No. 9, Sep. 1979, pp. 1335-1342.

Fenney, S., "Texture Compression using Low-Frequency Signal Modulation," Graphics Hardware, 2003, 9 pages.

Inada et al., "Compressed Lossless Texture Representation and Caching," Graphics Hardware, 2006, pp. 111-120.

Munkberg et al., "High Quality Normal Map Compression," Graphics Hardware, 2006, 8 pages.

Pettersson et al., "Texture Compression: THUMB—Two Hues Using Modified Brightness," Computer Science, Nov. 23, 2005, pp. 7-12, retrieved from https://www.semanticscholar.org/paper/Texture-Compression%3A-THUMB%3A-Two-Hues-Using-Modified-Pettersson-Str%C3%B6m/623773016a9b9db73fac2b0165a338b8fb733681.

Torborg et al., "Talisman: Commodity Realtime 3D Graphics for the PC," SIGGRAPH '96, Proceedings of the 23rd annual conference on Computer graphics and interactive techniques, Aug. 1996, pp. 353-363.

Aila et al., "Delay Streams for Graphics Hardware," ACM Transactions on Graphics, 2003, pp. 792-800.

Knittel et al., "Hardware for Superior Texture Performance," Computers & Graphics, 1996, 8 pages, retrieved from https://diglib.eg.org/bitstream/handle/10.2312/EGGH.EGGH95.033-040/033-040.pdf?sequence=1.

Strom et al., "PACKMAN: Texture Compression for Mobile Phones," SIGGRAPH, 2004, 1 page.

* cited by examiner

EXPLOITING REDUNDANT BIT COMBINATIONS IN A COMPRESSED REPRESENTATION OF AN IMAGE

RELATED APPLICATION(S)

This application claims the benefit of U.S. Provisional Application No. 63/389,328 titled "EXPLOITING REDUNDANT BIT COMBINATIONS IN TEXTURE COMPRESSION," filed Jul. 14, 2022, the entire contents of which is incorporated herein by reference.

TECHNICAL FIELD

The present disclosure relates image processing schemes, including image compression and decompression schemes.

BACKGROUND

Image processing schemes are typically used to render images for presentation on a display device, and usually involve some image (e.g. texture) compression to reduce a size of the image data which in turn reduces the bandwidth, storage, and processing power requirements associated with the processing of the image. It is a general goal to exploit the compressed image bits as well as possible, namely ensuring that as much of the compressed image bits as possible provide some meaning during image decompression, which in turn allows for a higher quality image.

When a block compression scheme, in particular, is used for image compression, it is possible for a resulting image block to have redundancies therein. For example, an image block, which will include two sets of bits (each representing a respective color value), is susceptible to a situation where those two sets of bits are redundant. In this case, one of the sets of bits will be considered meaningless. Put another way, the same decompressed block of pixels can be achieved using another two sets of bits and since the same decompressed block of pixels can be obtained in two (or more) different ways, the one (or more) ways are considered meaningless. Existing image processing schemes have been adapted to exploit the situation where a block of a compressed image includes two sets of bits that are identical, by using a specially designed compression process where the redundant bits are instead used for a dedicated discriminating purpose as opposed to the normal block encoding, thereby providing some meaning to the bits.

However, there are many more redundancies that can occur in image compression, beyond the simple case of identical bit sets per block. To date, these additional redundancies have not been identified nor exploited by existing image processing schemes. There is a need for addressing these issues and/or other issues associated with the prior art.

SUMMARY

A method, computer readable medium, and system are disclosed for exploiting redundant bit combinations in a compressed representation of an image. In an embodiment, a block of an image is compressed using a default block compression scheme to generate a first compressed representation of the block, the default block compression scheme configured to generate a compressed representation of a given block that includes a first set of bits representing a first value and a second set of bits representing a second value. A first error is computed for the first compressed representation of the block. The block of the image is compressed using an auxiliary block compression scheme to generate a second compressed representation of the block, the auxiliary block compression scheme configured to exploit a plurality of redundant bit combinations supported by the default block compression scheme, each redundant bit combination of the plurality of redundant bit combinations occurring when a difference between the first set of bits in the compressed representation and the second set of bits in the compressed representation is between 0 and a defined threshold, wherein the defined threshold is greater than 0. A second error is computed for the second compressed representation of the block. A selection is made between the first compressed representation of the block and the second compressed representation of the block, based on the first error and the second error, to result in a selected compressed representation of the block. The selected compressed representation of the block is stored in a compressed representation of the image.

In another embodiment, a compressed representation of a block of an image, which is stored in a compressed representation of the image, is selected for decompression. It is determined, from bits in the compressed representation of the block, which block compression scheme was used to create the compressed representation of the block, the block compression scheme being determined from among: a default block compression scheme configured to generate a particular compressed representation of a given block that includes a first set of bits representing a first value and a second set of bits representing a second value, and an auxiliary block compression scheme configured to exploit a plurality of redundant bit combinations supported by the default block compression scheme, each redundant bit combination of the plurality of redundant bit combinations occurring when a difference between the first set of bits in the particular compressed representation and the second set of bits in the particular compressed representation is between 0 and a defined threshold, wherein the defined threshold is greater than 0. The compressed representation of the block is decompressed using a block decompression scheme corresponding to the determined block compression scheme.

DETAILED DESCRIPTION

Figure 1:
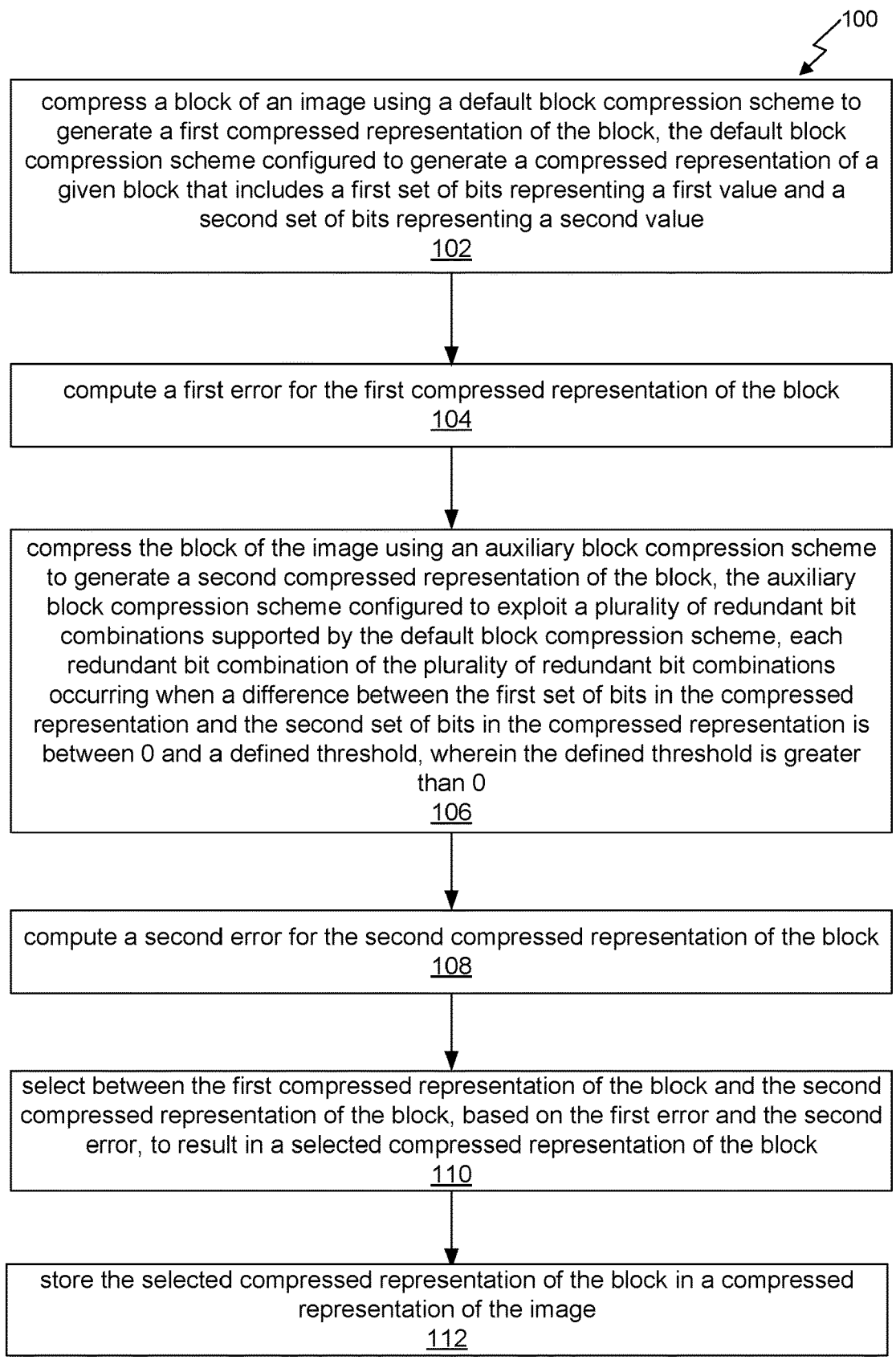
FIG. 1 illustrates a flowchart of a method for exploiting redundant bit combinations in a compressed representation of an image, in accordance with an embodiment.

Image processing schemes, which are typically used to render images for presentation on a display device, generally implement image (e.g. texture) compression to reduce a size of the image data which in turn reduces the bandwidth, storage, and/or processing power requirements associated with various image processing tasks. In order to then render the image, the compressed representation of the image will be decompressed and the decompressed representation of the image will be rendered. Thus, an image processing scheme will include both an image compression scheme and a corresponding image decompression scheme.

In order for the decompressed representation to match the original image as closely as possible, it is desired that the image processing scheme exploit the compressed image bits as well as possible, namely ensuring that as much of the compressed image bits as possible provide some meaningful (e.g. useful) contribution to the decompression of the image. However, when a block compression scheme is used for image compression, it is possible for a resulting compressed image block (representing a portion of the original image) to have redundant data therein. For traditional image processing schemes, this redundant data will provide no meaningful contribution to the decompression of the image block.

For example, for a block compression scheme, an image to be compressed will be decomposed (e.g. partitioned, etc.) into a number of image blocks (e.g. tiles) each including multiple image elements (pixels or texels). Each block may then be compressed such that the compressed block stores at least two values (i.e. bit sets) representative of the portion of the image included in the block. In an embodiment, these values may be the minimum and maximum color (RGB or grayscale) values of the image elements in the image block, or RGB values may be found by fitting a line to the RGB pixel data in the block and then using the end points of the projected original RGB values onto this line as the "minimum" and "maximum" values. Further, the compressed block may also store, for each pixel in the block, an index into a value set computed using the representative values, such as a color set that consists of the minimum and maximum color values as well as additional colors in-between those minimum and maximum color values.

Thus, a compressed image block, which will include, at least in part, two sets of bits (for example each representing a respective color value, such as the minimum and maximum color values), is susceptible to a situation where those two sets of bits are redundant. In this case, one of the sets of bits will be considered meaningless with regard to its contribution during decompression of the compressed image block. Some image processing schemes have been proposed to exploit the situation where a compressed image block includes two sets of bits that are redundant by virtue of them being identical, but these image processing schemes do not consider other practical redundancies that can manifest from image compression.

The present disclosure provides a technique for detecting redundant bit combinations beyond the simple case of identical bit sets per block, which can then be exploited, for example to provide improved quality of the decompressed image. As described herein, the redundant bit combinations may be exploited with an auxiliary processing mode that is specifically configured for this purpose, as opposed to a default (traditional) processing mode under which the redundant bit combinations would be meaningless. Possible embodiments of the auxiliary processing mode will also be described herein. The image processing schemes described herein may be configured to include a default processing mode (with default compression and decompression schemes), as well as an auxiliary (e.g. complementary) processing mode (with auxiliary compression and decompression schemes) that may be utilized to exploit cases of redundant bit combinations supported in the default processing mode.

FIG. 1 illustrates a flowchart of a method 100 for exploiting redundant bit combinations in a compressed representation of an image, in accordance with an embodiment. The method 100 may be performed by any device that includes a processing unit, a program, custom circuitry, and/or any combination of the same. For example, the method 100 may be executed by a GPU (graphics processing unit), CPU (central processing unit), or any processor capable of image processing. As another example, the method 100 may be performed by the computing system of FIG. 8. Furthermore, persons of ordinary skill in the art will understand that any system that performs the method 100 is within the scope and spirit of embodiments of the present disclosure.

In operation 102, a block of an image is compressed using a default block compression scheme to generate a first compressed representation of the block, the default block compression scheme configured to generate a compressed representation of a given block that includes a first set of bits representing a first value and a second set of bits representing a second value. As noted above, the image may be decomposed into a plurality of blocks. Each block may correspond with a different portion of the image, and may include for example a tile covering a section of the image. Each block may have a defined height and width, and may cover a plurality of pixels each having a corresponding value (e.g. color value). The present operation (102) may therefore apply to a selected block of the image.

In various possible embodiments, the default block compression scheme that is applied to the block may be a select one of the BC1 through BC7 block compression schemes, for example. BC1-BC7 are used with Microsoft's™ Direct 3D™, and are supported by a majority of GPUs. Of course, any other block compression scheme may be used as the default block compression scheme, as long as it operates to generate a compressed representation of the block as defined above.

In particular, as mentioned, the default block compression scheme is configured to generate a compressed representation of a given block that includes a first set of bits representing a first value and a second set of bits representing a second value. Thus, compressing the block in operation 102 will accordingly generate the first compressed representation of the block having the first set of bits representing a first value and the second set of bits representing a second value. The first value and the second value may be values of certain image elements (e.g. pixels or texels) which may or may not exist within the block of the image prior to the compression. In an embodiment, the first value may be a first color (e.g. grayscale or RGB) value and the second value may be a second color (e.g. grayscale or RGB) value. In an embodiment, the first value may be a minimum (e.g. color) value selected based on image elements in the block and the second value may be a maximum (e.g. color) value selected based on the image elements in the block, or vice versa. For example, see the description above related to minimum and maximum color (RGB or grayscale) values. In an embodiment, the first compressed representation of the block may further include a per-pixel index value pointing to either the first value, the second value, or a value (e.g. interpolated) therebetween.

In operation 104, a first error is computed for the first compressed representation of the block. In an embodiment, the first error may be a compression error. The compression error may refer to an error caused by the default block compression scheme. For example, the first error may be computed by comparing the (original, uncompressed) block to a first decompressed representation of the block resulting from decompression of the first compressed representation of the block.

In operation 106, the block of the image is compressed using an auxiliary block compression scheme to generate a second compressed representation of the block, the auxiliary block compression scheme configured to exploit a plurality of redundant bit combinations supported by the default block compression scheme, each redundant bit combination of the plurality of redundant bit combinations occurring when a difference between the first set of bits in the compressed representation and the second set of bits in the compressed representation is between 0 and a defined threshold, wherein the defined threshold is greater than 0.

The auxiliary block compression scheme will be configured prior to execution of operation 106, and in particular will be configured specifically to exploit the redundant bit combinations supported by the default block compression scheme used in operation 102. In general, different block compression schemes will typically have different parameters associated therewith, such as a number of bits used for (to store) each of the first set of bits and the second set of bits, and a number of bits used for (to store) each image element index. As a result of these different parameters, different block compression schemes may support different redundant bit combinations. Accordingly, the auxiliary block compression scheme used in operation 106 may be tailored to exploit the particular redundant bit combinations supported in the default block compression scheme used in operation 102. Exploiting the redundant bit combinations refers to using the redundant bit combinations for another dedicated discriminating purpose that differs from the default encoding otherwise generated by the default block compression scheme. This dedicated discriminating purpose may be configured to give meaning to the otherwise meaningless redundant bit combinations (in terms of decompression), which in turn may allow for a quality of the decompressed image to be improved.

As noted above, the auxiliary block compression scheme is configured to exploit redundant bit combinations specifically occurring when a difference between the first set of bits in the compressed representation (generated by the default block compression scheme compressing the given block) and the second set of bits in the compressed representation is between 0 and a defined threshold, where the defined threshold is greater than 0. The defined threshold may be selected to ensure that every bit combination supported by the default block compression scheme and having two or more repeated values among the first value, the second value, and their interpolated values is identified as a redundant bit combination. In an embodiment, the defined threshold may be selected based on parameters of the default block compression scheme. The parameters may include a number of bits used for each of the first set of bits and the second set of bits, and a number of bits used for each image element index. Thus, contrary to prior art solutions that only detect identical bit sets (difference=0) as being redundant, the auxiliary block compression scheme of the present disclosure will exploit additional practical redundancies supported in the default block compression scheme.

In an embodiment, the auxiliary block compression scheme may be configured based on a count of the plurality of redundant bit combinations supported by the default block compression scheme. In an embodiment, the auxiliary block compression scheme may be further configured to use a number of bits recovered based on the count of the plurality of redundant bit combinations supported by the default block compression scheme. In an embodiment, the auxiliary block compression scheme may be configured to use the number of bits for encoding higher quality image data. For example, the auxiliary block compression scheme may be configured to use the number of bits to store a high resolution color value (c), a delta color value (d), and an indicator per pixel that selects between (c) and (d).

In an embodiment, the auxiliary block compression scheme may be configured to use the number of bits to provide a smooth interpolation. For example, in an embodiment, wherein the auxiliary block compression scheme may be configured to use the number of bits to store values at each corner pixel of four corner pixels of a given block, wherein values of remaining pixels in the given block are interpolated based on the stored four corner pixel values. In an embodiment, the auxiliary block compression scheme may be configured to use the number of bits to store values including: a first set of values for four corner pixels of a given block, delta values for corner pair values per outer edge of the given block, and a middle point value computed from the delta values, where values of remaining pixels in the given block are interpolated based on the stored values. Embodiments for configuring the auxiliary block compression scheme will be described with reference to subsequent figures below.

As mentioned above, operation 106 is performed to generate a second compressed representation of the block using the auxiliary block compression scheme. In an embodiment, one or more bits in the second compressed representation of the block may indicate that the second compressed representation of the block was generated using the auxiliary block compression scheme. For example, a bit set comprised of the first set of bits representing a first value and the second set of bits representing a second value may be configured to indicate that the second compressed representation of the block was generated using the auxiliary block compression scheme. In an embodiment, the second compressed representation of the block may include a selection portion (bits) that has an indicator of the auxiliary block compression scheme, as well as a payload portion (bits) that includes the actual encoding of the block generated using the auxiliary block compression scheme.

In operation 108, a second error is computed for the second compressed representation of the block. In an embodiment, the second error may be a compression error. This compression error may refer to an error caused by the auxiliary block compression scheme. For example, the second error may be computed by comparing the (original, uncompressed) block to a second decompressed representation of the block resulting from decompression of the second compressed representation of the block.

In operation 110, a selection is made between the first compressed representation of the block and the second compressed representation of the block, based on the first error and the second error, to result in a selected compressed representation of the block. In an embodiment, the compressed representation that is selected may be the one with the least error. For example, the first compressed representation of the block may be selected when the first error is less than the second error, and the second compressed representation of the block may be selected when the second error is less than or equal to the first error.

In operation 112, the selected compressed representation of the block is stored in a compressed representation of the image. The selection made in operation 110 may ensure that the second compressed representation of the block is only used for the compressed representation of the image when a quality of the decompressed representation of the block will actually be improved by its use.

It should be noted that while the method 100 refers to a (e.g. selected) block of the image, the method 100 may likewise be repeated for each of a plurality of additional blocks of the image. It should also be noted that while operations 102-108 of the method 100 are disclosed in a certain order, the method 100 is not limited to the order in which these operations are described. For example, the second compressed representation of the block may be generated, and its corresponding error may be computed, prior to the generation of the first compressed representation of the block and prior to the computation of its corresponding error. As another example, the errors for both the first compressed representation of the block and the second compressed representation of the block may be computed after both such compressed representations have been generated.

Employing the auxiliary block compression scheme of an auxiliary processing mode, as disclosed in the method 100, will provide an improved quality of a decompressed image (i.e. due to the exploitation mentioned herein). This auxiliary processing mode may be configured to support numerous systems and processes, such as accelerating rendering for rasterization and ray tracing, rendering in three-dimensional (3D) simulation platforms, real-time rendering, offline rendering, rendering used in car simulations, rendering of physical simulations that use textures, systems that use texture for deep learning, among others. By improving the quality of decompressed images, the quality of output of the systems and/or processes that use these decompressed images will also in turn be improved.

More illustrative information will now be set forth regarding various optional architectures and features with which the foregoing framework may be implemented, per the desires of the user. It should be strongly noted that the following information is set forth for illustrative purposes and should not be construed as limiting in any manner. Any of the following features may be optionally incorporated with or without the exclusion of other features described.

Figure 2:
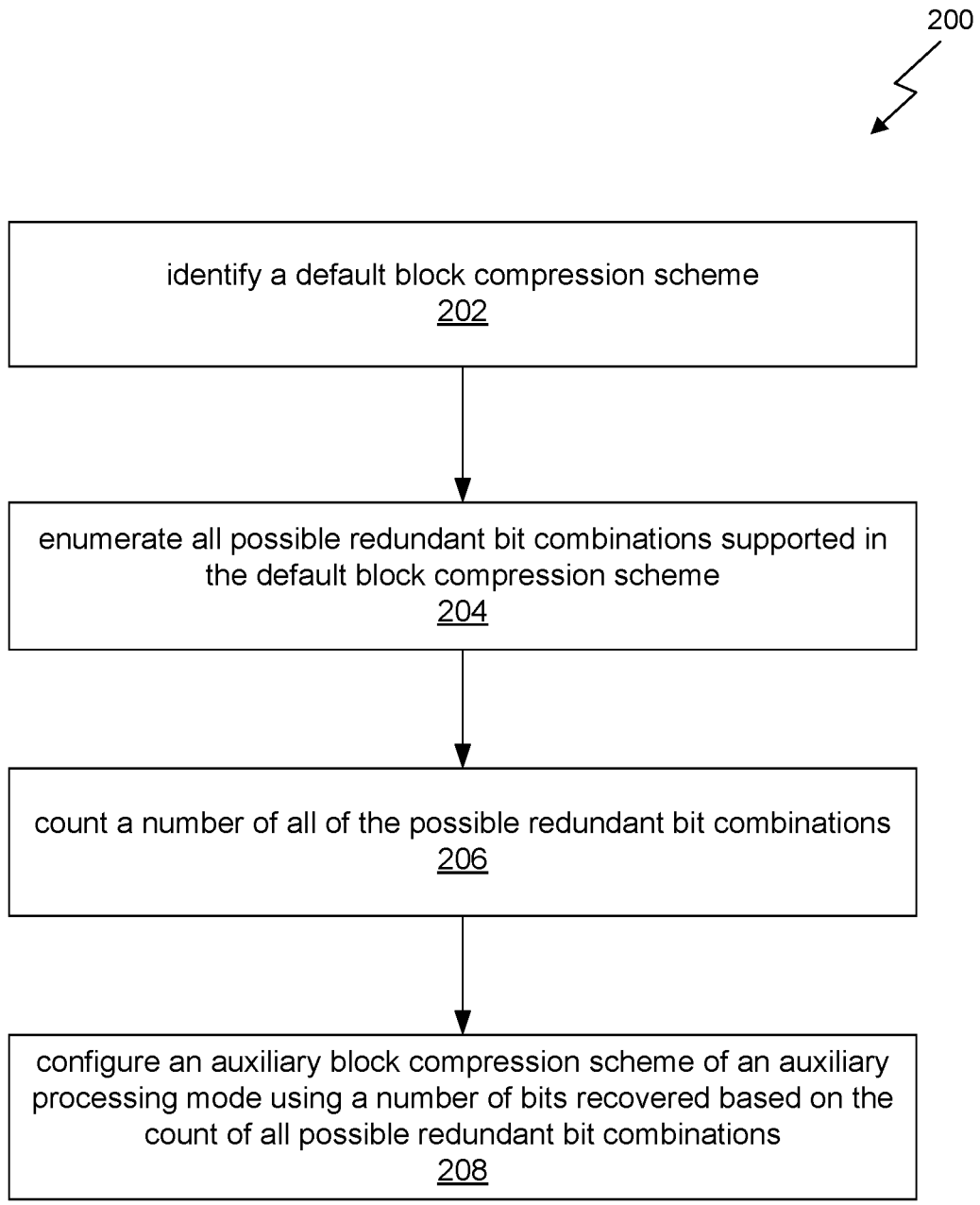
FIG. 2 illustrates a flowchart of a method for configuring an auxiliary processing mode that exploits redundant bit combinations in a compressed representation of an image, in accordance with an embodiment.

FIG. 2 illustrates a flowchart of a method 200 for configuring an auxiliary block compression scheme of an auxiliary processing mode that exploits redundant bit combinations in a default block compression scheme, in accordance with an embodiment.

In operation 202, a default block compression scheme is identified. The default block compression scheme may be one of BC1-BC7, for example.

In operation 204, all possible redundant bit combinations supported in the default block compression scheme are enumerated. A bit combination refers to a combination of bits capable of resulting from compression of a given block using the default block compression scheme. The possible redundant bit combinations may therefore include all bit combinations supported in the default block compression scheme in which the representative values included therein are identical, as well as all bit combinations supported in the default block compression scheme where one or more values interpolated from the representative values is identical to one of the representative values.

In operation 206, a number of all of the possible redundant bit combinations is counted. In operation 208, the auxiliary block compression scheme of an auxiliary processing mode is configured using a number of bits recovered based on the count of all of the possible redundant bit combinations.

In an embodiment, the auxiliary block compression scheme may use the number of bits for encoding higher quality image data. Just by way of example, the auxiliary block compression scheme may use the number of bits to store a high resolution color value (c), a delta color value (d), and an indicator per pixel that selects between (c) and (d). In another embodiment, the auxiliary block compression scheme may use the number of bits to provide a smooth interpolation, for example by storing other representative values of the block, in addition to the first and second values that are stored, which can all together be used when interpolating values for remaining pixels of the block.

Figure 3:
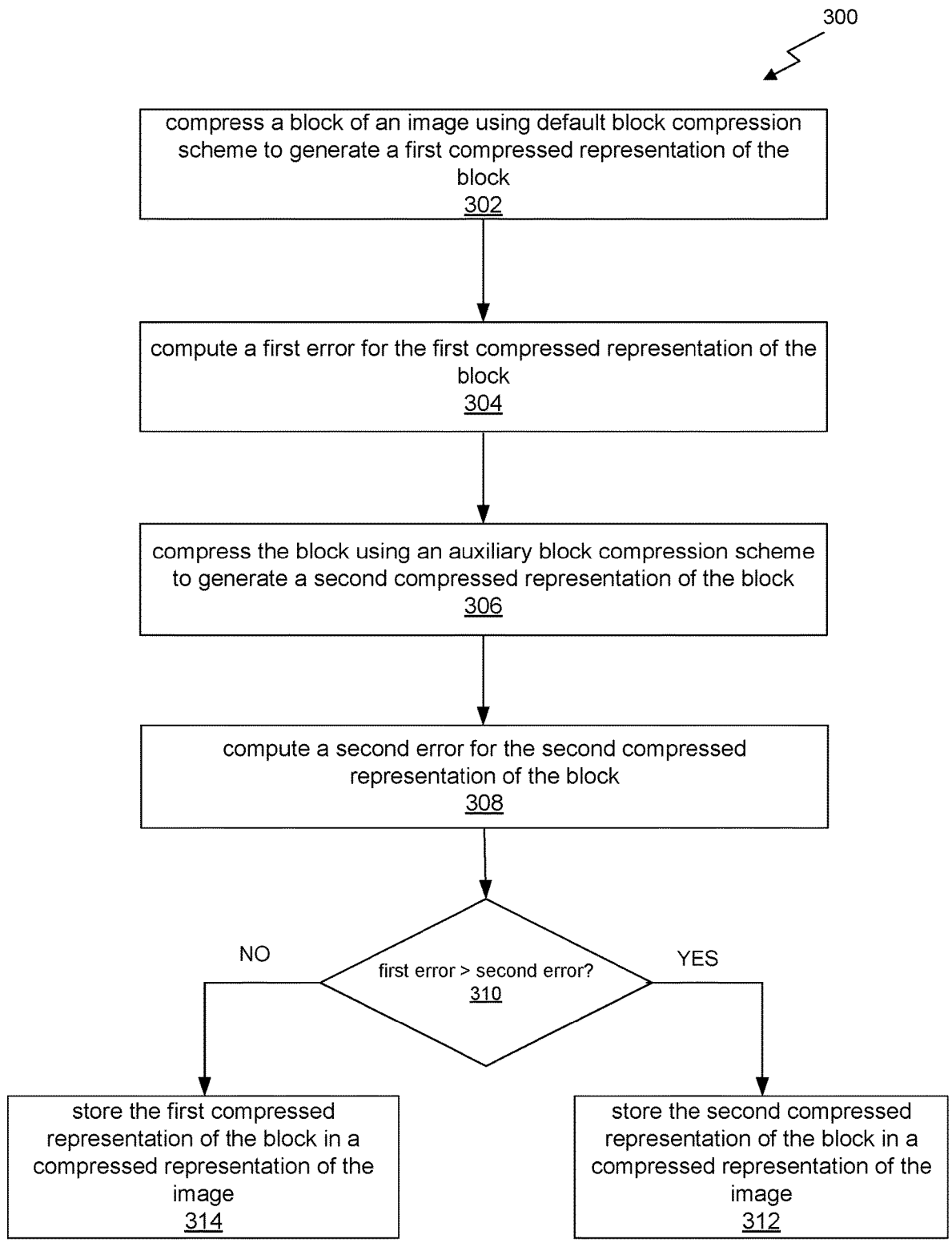
FIG. 3 illustrates a flowchart of a method for compressing a portion of an image, in accordance with an embodiment.

FIG. 3 illustrates a flowchart of a method 400 for compressing a block of an image, in accordance with an embodiment.

In operation 302, a block of an image is compressed using a default block compression scheme (i.e. of a default processing mode) to generate a first compressed representation of the block. In operation 304, a first error for the first compressed representation of the block is computed.

In operation 306, the block of the image is compressed using an auxiliary compression scheme (i.e. of an auxiliary processing mode) to generate a second compressed representation of the block. In operation 308, a second error for the second compressed representation of the block is computed.

In decision 310, it is determined whether the first error is greater than the second error. Responsive to determining that the first error is greater than the second error, then in operation 312 the second compressed representation of the block is stored in a compressed representation of the image. On the other hand, responsive to determining that the first compression error is not greater than the second compression error, then in operation 314 the first compressed representation of the block is stored in a compressed representation of the image.

It should be noted that the method 300 may be repeated for each block of the image. The method 300 may process each block of the image in a sequential manner in one embodiment, or may process two or more block of the image in parallel in another embodiment.

Figure 4:
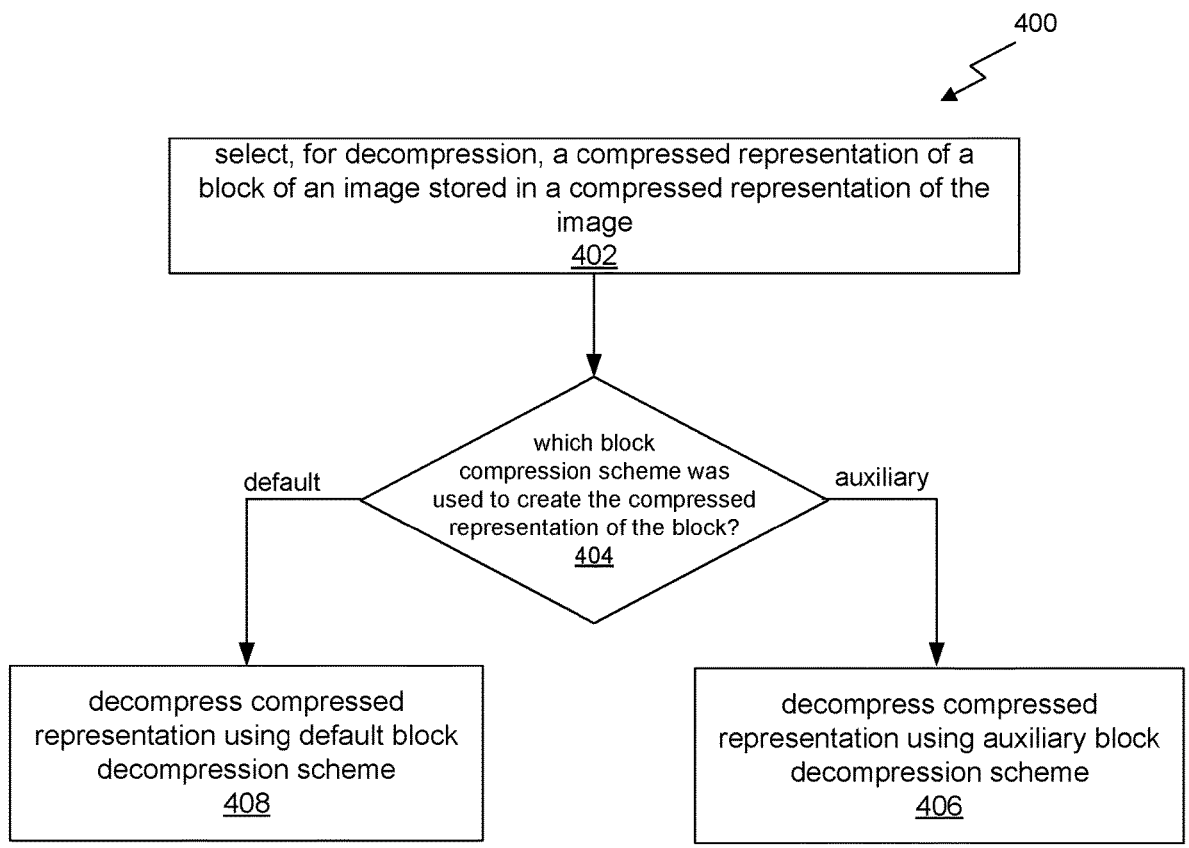
FIG. 4 illustrates a flowchart of a method for decompressing a compressed representation of a block of an image, in accordance with an embodiment.

FIG. 4 illustrates a flowchart of a method 400 for decompressing a compressed representation of a block of an image, in accordance with an embodiment.

In operation 402, a compressed representation of a block of an image, which is stored in a compressed representation of the image, is selected for decompression.

In decision 404, it is determined, from bits in the compressed representation of the block, which block compression scheme was used to create the compressed representation of the block. With respect to the present embodiment, the block compression scheme is determined from among: (a) a default block compression scheme configured to generate a particular compressed representation of a given block that includes a first set of bits representing a first value and a second set of bits representing a second value, and (b) an auxiliary block compression scheme configured to exploit a plurality of redundant bit combinations supported by the default block compression scheme, where each redundant bit combination of the plurality of redundant bit combinations occurs when a difference between the first set of bits in the particular compressed representation and the second set of bits in the particular compressed representation is between 0 and a defined threshold, where the defined threshold is greater than 0.

In an exemplary embodiment, when a block of an image is compressed using the auxiliary block compression scheme, the resulting compressed representation may include some indicator that the compressed representation is to be processed in accordance with the auxiliary processing mode. For example, the compressed representation may include a selection portion that has an indicator of the auxiliary block compression scheme, as well as a payload portion that includes the actual encoding of the block generated using the auxiliary block compression scheme. If the selection portion is not included in the compressed representation, then it may be assumed (by default) that the block was compressed using the default block compression scheme.

In an embodiment, the selection portion (i.e. indicating that a block has been compressed using the auxiliary mode) and the payload will use the same bits. In this embodiment, if a redundant bit combination exists, then the block is in auxiliary mode, particularly since the default mode would never use any redundant bit combination because the same result can be obtained in other ways. In this case, any of the possible redundant bit combinations can be used, which means that we can encode a number between 0 and N, where N is the total number of possible redundant bit combinations minus one. This is then used to store the payload. It should be noted that the index bits per pixel can also be reused, embodiments of which are described in detail below. Accordingly, if a block has stored the first value and the second value such that they together store a redundant combination, then that block "has selected" that it is of the type auxiliary, and part of the payload may also be encoded in the same data.

In other words, determining, from the bits in the compressed representation of the block, which block compression scheme was used to create the compressed representation of the block may include determining that the auxiliary block compression scheme was used to create the compressed representation of the block when the bits in the compressed representation indicate the auxiliary block compression scheme, otherwise, determining that the default block compression scheme was used to create the compressed representation of the block. In an embodiment, the bits in the compressed representation of the block that are used to determine which block compression scheme was used to create the compressed representation of the block may include a bit set comprised of the first set of bits representing a first value and the second set of bits representing a second value.

The compressed representation of the block is then decompressed using a block decompression scheme corresponding to the determined block compression scheme, as illustrated in operations 406-408. In particular, responsive to determining that the auxiliary block compression scheme was used to create the compressed representation of the block, then in operation 406 the compressed representation is decompressed using an auxiliary bock decompression scheme corresponding to the auxiliary block compression scheme. On the other hand, responsive to determining that the default block compression scheme was used to create the compressed representation of the block, then in operation 408 the compressed representation is decompressed using a default block decompression scheme corresponding to the default block compression scheme.

In various embodiments, the decompression may be performed for at least one of: accelerated rendering for rasterization and ray tracing, rendering in a three-dimensional (3D) simulation platform, real-time rendering, offline rendering, rendering used in car simulation, rendering of a physical simulation that uses textures, and/or a system that uses texture for deep learning.

Figure 5:
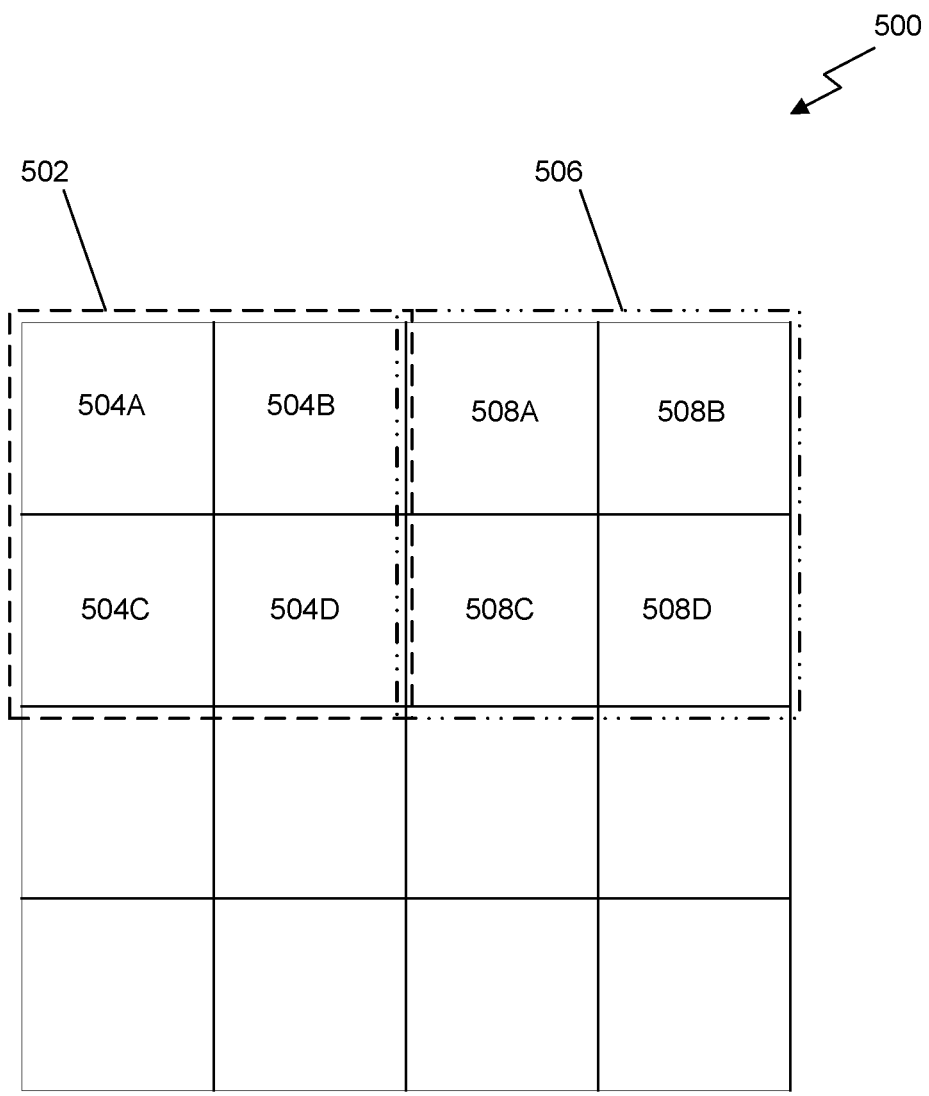
FIG. 5 illustrates an image decomposed into image blocks, in accordance with an embodiment.

FIG. 5 illustrates an image 500 decomposed into blocks, in accordance with an embodiment. The image 500 includes rows and columns of image elements (e.g. pixels). The image is decomposed into image blocks that each include a different subset of the image elements. For example, image block 502 includes image elements 504A-D. Likewise, image block 506 includes image elements 508A-D. It should be noted that most block compression schemes use 4×4 pixels per block instead of 2×2 as shown here. The 2×2 example shown is only for illustration.

When a block of an image is compressed, the image elements therein are encoded in accordance with the compression scheme used. The compressed representation of the block will accordingly utilize less bits to represent the original (uncompressed) block of the image. However, when an image block is compressed using a default block compression scheme, it is possible that the default block compression scheme does not fully exppploit the bits it has to find a compression representation. As a result, image quality might be better if the bits were used in a better way (e.g. with an auxiliary block compression scheme).

For example, a compressed representation resulting from compression of a block 502 may store two representative values (as bit sets) selected, or otherwise derived, from image elements 504A-D, and remaining image elements 504A-D may each point to one of the two representative values or to a value interpolated therebetween. It is therefore possible for the two representative values to be redundant (identical) or for one of the two representative values to be redundant with an interpolated value. In this case, the compressed representation will be considered to have a redundant bit combination.

Since the redundant data will be meaningless with regard to decompression of the compressed representation, an auxiliary block compression scheme may instead be used to compress the block. The auxiliary block compression scheme may be configured to exploit the redundant bit combinations of the default block compression scheme to provide more meaningful information in a resulting compressed representation.

Figure 6:
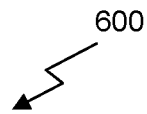
FIG. 6 illustrates a compressed representation of a block generating using one configuration of an auxiliary block compression scheme, in accordance with an embodiment.

FIG. 6 illustrates a compressed representation of a block 600 generating using one configuration of an auxiliary block compression scheme, in accordance with an embodiment. With respect to the present embodiment, the auxiliary block compression scheme has been configured to exploit the redundant bit combinations of a BC4 compression scheme.

For smoothly varying blocks of 4×4 pixels, the 8-bit grayscale values can be stored at the 4 corners of the block, and the rest interpolated. As can be seen, the corner positions are called A, B, C, and D, and at each of these, an 8-bit value is stored. These are called $v_A$, $v_B$, $v_C$, and $v_D$. The pixels where there are no values are marked with Xs. The grayscale values at the Xs would be computed using bilinear interpolation with $v_A$, $v_B$, $v_C$, and $v_D$. This only uses 4·8=32 bits though, while we have 58 bits to work with (see explanation in the BC4 implementation described below).

Figure 7:
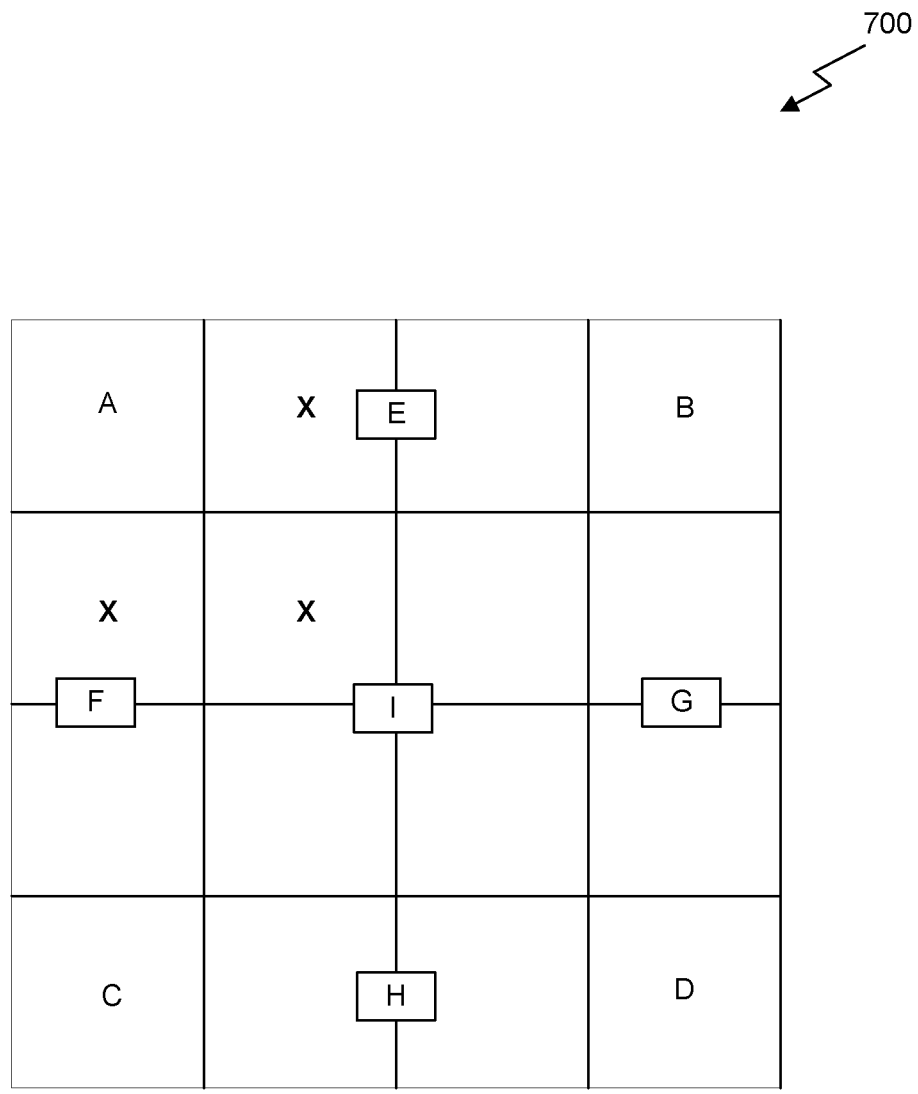
FIG. 7 illustrates a compressed representation of a block generating using another configuration of an auxiliary block compression scheme, in accordance with an embodiment.

FIG. 7 illustrates a compressed representation of a block 700 generating using another configuration of an auxiliary block compression scheme, in accordance with an embodiment. With respect to the present embodiment, the auxiliary block compression scheme has been configured to exploit the redundant bit combinations of a BC4 compression scheme. The auxiliary compression scheme of this embodiment provides a more accurate solution than provided by the auxiliary compression scheme described in FIG. 6.

Similar to the auxiliary compression scheme described in FIG. 6, $v_A$, $v_B$, $v_C$, and $v_D$ are stored using 8 bits at the pixels denoted A, B, C, and D. In addition, delta values are stored at positions E, F, G, and H in the block 700. These delta values are denoted $\Delta_E$, $\Delta_F$, $\Delta_G$, and $\Delta_H$, and to fit in our budget of extracted bits, they would be stored using only 5 bits each. Note that these 5-bit values are signed, which means that they are in the interval: [−16, 15]. The final values at E, for example, is constructed as the average of the values at A and B, and then offset using $\Delta_E$. This is expressed using the equation illustrated in Equation 1.

$$v_E = \frac{v_A + v_B}{2} + k_{AB} \cdot \Delta_E, \qquad \text{Equation 1}$$

where $k_{AB}$ is a positive number.

In the simplest case $k_{AB}=1$, but it could also be computed as a function of $v_A$ and $v_B$, e.g., if $|v_A - v_B| > t0$, i.e., the absolute value of the difference between $v_A$ and $v_B$ is larger than a threshold t0 then we can use $k_{AB}=2$ and otherwise use $k_{AB}=1$, for example. In an embodiment, we could just say that $k_{AB}=f(v_A, v_B)$, i.e., $k_{AB}$ is computed as function of $v_A$ and $v_B$. Note that $v_F$, $v_G$, and $v_H$ are computed analogously. The middle value at location I would be the average of the $v_E$, $v_F$, $v_G$, and $v_H$ values and then a delta added on top of that as shown in Equation 2.

$$v_I = \frac{v_E + v_F + v_G + v_H}{4} + k_{EFGH} \cdot \Delta_I, \qquad \text{Equation 2}$$

where $k_{EFGH}=1$ in the simplest case, and in the general case, where $k_{EFGH}=g(v_E, v_F, v_G, v_H)$, i.e., a function of the values $v_E$, $v_F$, $v_G$, and $v_H$. Or it could even be $k_{EFGH}=g(v_A, v_B, v_C, v_D, v_E, v_F, v_G, v_H)$ Note that we need the pixel colors at the Xs (we already have them at positions A, B, C, and D). For the upper left quadrant, the values at the Xs would simply be (bilinearly) interpolated from the values at A, E, F, and I, i.e., using $v_A$, $v_E$, $v_F$, and $v_I$. This is done similarly for the other quadrants. In total, this would cost 8·4+5·5=32+25=57 bits, which is less than what we can afford. The last bit could possibly be used to control the scaling factors of the k-values.

Additional Auxiliary Compression Scheme—1

Another auxiliary compression scheme for BC4 may be configured to store eight 7-bit gray scale values, which would use 7·8=56 bits. Each 2×1 subblock would then get a unique grayscale. An additional two bits could determine whether to use two 2×1 subblocks per 2×2 pixels or two 1×2 subblocks. This is likely to be useful for tiles with edges in them.

Additional Auxiliary Compression Scheme—2

One possible auxiliary compression scheme for BC1 may provide a special mode for smoothly varying blocks. For BC1, 52.6 bits may be extracted for such a mode. In this case, we can store colors in three corners of the block. For 52 bits, we could store these three colors with 6+6+6 bits (r+g+b) for the first color, and 6+6+5 bits for the two remaining corners. This sums to 18+2·17=52 bits. The rest of the colors are interpolated.

Exemplary Implementation Using BC4

BCn-like texture compression schemes tend to use the following variables:

m: number of bits per color/grayscale value.
n: number of per-pixel index bits.
w: tile width.
h: tile height.

Since two colors or grayscale values are stored per w×h tile of pixels, the total storage per tile is 2m+whn bits. For BC4, for example, m=8, n=3, and w=h=4, which means that total storage per tile is 2·8+3·42=64 bits, i.e., 4 bits per pixel (BPP). We denote color0 (or gray0) by $c_0$ and color1 (or gray 1) by $c_1$.

Prior solutions have managed to exploit only the case where $c_0 == c_1$. Here, we extend the number of redundant bit combinations. We start by explaining our method with an example for BC4, where m=8, n=3, and w=h=4. Our observation is that if, for example, $c_1 = c_0 + 1$, then that is also a meaningless combination, since the same can be achieved with $c1 = c_0 + 7$. This is so because the interpolated colors between $c_0$ and $c_0 + 7$ would be $c_0$, $c_0 + 1$, $c_0 + 2$, $c_0 + 3$, $c_0 + 4$, $c_0 + 5$, $c_0 + 6$, $c_0 + 7$, i.e., both $c_0$ and $c_0 + 1$ are included and no other colors can be interpolated between these numbers.

We start by counting the number of redundant occurrences that we can find, and then explain how these can be turned into a number, which can be used to encode a novel (i.e. auxiliary) compression scheme of BCn-like compression schemes.

Counting the Number of Redundant Occurrences

Table 1 shows all the combinations of co and ci that are meaningless in this way for BC4. Note that they have been separated into two terms, where the number of pairs in term 1 is the product of two values and term 2 is a tail-term, which can be expressed as a sum. Prior solutions have only managed to find the first row of both term 1 and term 2, but not the rest of the cases.

TABLE 1

| | $c_0/c_1$ | $c_0/c_1$ | $c_0/c_1$ | $c_0/c_1$ | $c_0/c_1$ | $c_0/c_1$ |
|---|---|---|---|---|---|---|
| term 1 | 0/0 | 1/1 | 2/2 | ... | 248/248 | 249/249 |
| | 0/1 | 1/2 | 2/3 | ... | 248/249 | 249/250 |
| | 0/2 | 1/3 | 2/4 | ... | 248/250 | 249/251 |
| | 0/3 | 1/4 | 2/5 | ... | 248/251 | 249/252 |
| | 0/4 | 1/5 | 2/6 | ... | 249/252 | 249/253 |
| | 0/5 | 1/6 | 2/7 | ... | 249/253 | 249/254 |
| | 0/6 | 1/7 | 2/8 | ... | 249/254 | 249/255 |
| term 2 | 250/250 | 251/251 | 252/252 | 253/253 | 254/254 | 255/255 |
| | 250/251 | 251/252 | 252/253 | 253/254 | 254/255 | — |
| | 250/252 | 251/253 | 252/254 | 253/255 | — | — |
| | 250/253 | 251/254 | 252/255 | — | — | — |
| | 250/254 | 251/255 | — | — | — | — |
| | 250/255 | — | — | — | — | — |
| | — | — | — | — | — | — |

Using Table 1 as a guideline, we find that the number of redundant bit combinations for BC4, denoted r, that we can recover from co and ci can be found using Equation 3.

$$r = \underbrace{(2^n - 1)(2^m - (2^n - 2))}_{\text{term 1}} + \underbrace{\sum_{k=1}^{2^n - 2} k}_{\text{term 2}}. \qquad \text{Equation 3}$$

Note that the terms marked with height and width are the height and width of term 1 in Table 1. Equation 3 can be simplified to Equation 4.

$$r=(2^n-1)(2^m-2^{n-1}+1).\qquad\text{Equation 4}$$

For BC4, this gives $r=(2^3-1)(2^8-2^2+1)=7\cdot253=1,771$, while prior solutions focusing only on $c_0==c$ can extract m bits out of $c_0$ and c, i.e., $2^8=256$. The embodiments of the present disclosure however extract $\log_2 1,771\approx10.8$, i.e., more than 2 additional bits compared to prior solutions.

An auxiliary processing mode may be configured to provide a higher resolution BC4-variant for 4×4 tiles with m=16 and n=6. This would give $r=(2^6-1)(2^{16}-2^5+1)=63\cdot65,505=4,126,815$. In prior solutions, they recover m bits from the two colors co and c. This mean that the auxiliary processing mode of the present embodiment is $63\cdot65,505/2^{16}\approx63$ times better than the prior solutions.

However, when looking at the number of bits that can be recovered, in the present embodiments this is $\log_2 4,126,815\approx22$ bits, which is about 6 more bits than the prior solution. This is a significant improvement.

For BC1, we have m=16 and n=2, which gives $r=3\cdot(2^{16}-1)=196,605$. Prior solutions can reuse 16+32=48 bits. On the other hand, embodiments of the present disclosure can reuse $\log_2(196,605)+32\approx49.6$ bits, which only gives about 1.6 extra bits here. However, this allows color to be handled in a much better way, as disclosed in more detail below.

Extracting the Redundant Bits

BCn compression schemes often extract a free bit by looking at the order of $c_0$ and c, and so therefore, we assume that this trick has already been used, and we can safely assume that $c_0 \leq c$.

For a decompression hardware unit to be able to use the image processing scheme described herein, one needs two steps. First, we need to detect, for each possible bit combination of the default block compression scheme, if $c_0$ and c "signal" that they constitute a redundant bit combination, which thus can be used for encoding a block using a different technique (i.e. the auxiliary block compression scheme). Second, we need to enumerate those redundant bit combinations into a number, whose bits then can be decoded.

For detection of redundant bit combinations, we introduce two boolean variables, $b_1$ and $b_2$, where $b_1=1$ if $c_0$ and c are determined to be part of term 1, otherwise $b_1=0$. Similarly, if $c_0$ and c are determined to be part of term 2, then $b_2=1$ and otherwise $b_2=0$. If $c_0$ and c neither are term 1 nor term 2, then the encoding is not in a redundant pattern.

These terms can be computed as illustrated in Equation 5.

$$b_1=\text{bool}(c_1-c_0\leq 2^n-2 \text{ and } c_0 < 2^m-(2^n-2)), b_2=\text{bool}(c_0\geq 2^m-(2^2-2)).\qquad\text{Equation 5}$$

Note that we never will get $b_1=1$ and $b_2=1$ at the same time, but they are both useful to have since $b_1$ or $b_2$ determines whether we have a redundant number situation.

For the second part, which is enumeration, we first enumerate all the numbers in term 1 as illustrated in Equation 6.

$$t_1 = \underbrace{(c_1-c_0)}_{y}\cdot\underbrace{(2^m-(2^n-2))}_{width}+\underbrace{c_0}_{x},\qquad\text{Equation 6}$$

This is which is similar to how you compute the index of a pixel (x, y) in a rectangular array with dimensions w×h. Such an index is computed as i=y·w+x.

For term 2, we introduce $d_0=2^m-1-c_0$ and $d_1=c_1-c_0$ to make the computations simpler. This transforms the lower part of Table 1 (term 2) into Table 2.

TABLE 2

|  | $d_0/d_1$ | $d_0/d_1$ | $d_0/d_1$ | $d_0/d_1$ | $d_0/d_1$ | $d_0/d_1$ |
|---|---|---|---|---|---|---|
| term 2 | 0/0 | 1/0 | 2/0 | 3/0 | 4/0 | 5/0 |
|  | — | 1/1 | 2/1 | 3/1 | 4/1 | 5/1 |
|  | — | — | 2/2 | 3/2 | 4/2 | 5/2 |
|  | — | — | — | 3/3 | 4/3 | 5/3 |
|  | — | — | — | — | 4/4 | 5/4 |
|  | — | — | — | — | — | 5/5 |
|  | — | — | — | — | — | — |

These pairs can then be enumerated (starting from 0) using Equation 7.

$$t_2 = d_1 + \sum_{k=0}^{d_0} k = d_1 + \frac{d_0(d_0+1)}{2}\qquad\text{Equation 7}$$

Term 1 and term 2 can then be combined into a single number using Equation 8.

$$t = b_1 t_1 + b_2(t_2 + \underbrace{(2^n-1)(2^m-(2^n-2))}_{\text{Amount of numbers in term 1}})\qquad\text{Equation 8}$$

Note that at this point, we know that we have detected a redundant bit combination, and this means that we can use $1-b_1$ instead of $b_2$ above. Finally, the number t can then be used for compressing the block using an auxiliary block compression mode and hence increase texture quality.

Also, recall that we can reuse all the index bits for compression if we detect a redundant bit case. For example, for BC4, we could extract 10.8 bits from $c_0$ and $c_1$, but we can also use all the 3·16=48 index bits, so for an auxiliary processing mode we have 48+10.8=58.8 bits to exploit. It is, of course, easiest to just use the 58 bits (out of 64 bits), but there may be ways to exploit the enumerations of the final 0.8 bits as well.

Handling Color

As mentioned above, if we just use m=16 and n=2, we get $r=3\cdot(2^{16}-1)=196,605$, which resulted in a total of 49.6 bits for BC1. For BC1, however, the 16 bits per color are split as $m_r=5$, $m_g=6$, and $m_b=5$, i.e., 5, 6, and 5 bits for r (red), g (green), and b (blue), respectively. Here, we present a way to exploit this. In fact, the trick can be used for any tuple of n values with possibly different bit budgets.

Now, let us compute the number of redundant bit combinations with respect to each of $m_r=5$, $m_g=6$, and $m_b=5$ using Equation 9.

$$r_r = (2^2-1)(2^5-2^1+1) = 3\cdot 31 = 93\qquad\text{Equation 9}$$
$$r_g = 2^2-1)(2^6-2^1+1) = 3\cdot 63 = 189$$
$$r_b = r_r = 93.$$

Now, our observation is that it suffices if all three (red, green, and blue) are redundant combinations at the same time. The number of such combinations must be found as illustrated in Equation 10.

$$r_{tot}=r_r\cdot r_g\cdot r_b,\qquad\text{Equation 10}$$

where each of $r_r$, $r_g$, and $r_b$ are computed using Equation 4 with $m_r$, $m_g$, and $m_b$, respectively.

In our example of BC1, this becomes $r_r \cdot r_g \cdot \sqrt{r_b} = 31 \cdot 189 \cdot 89 = 1,634,661$. The number of bits that our technique can reuse for BC1 is then $\log_w(1, 634, 661) + 32 \approx 52.6$, which is substantially more than prior solutions which can reuse only 48 bits.

Note that as long as $r_r$, $r_g$, and $r_b$ are computed using the parameters (n, $m_r$, $m_g$, and $m_b$) for a particular compression algorithm, the values for $r_r$, $r_g$, and $r_b$ are valid for that particular compression algorithm, i.e., this technique works for any compression algorithm that is similar to BCn techniques.

Compression/Decompression Using Redundant Bit Combination

Let us take BC4 as an example, and assume that we have an auxiliary processing mode from FIG. 7, which is to be indicated using a redundant bit combination.

Compression

For each 4×4 pixel block of the texture to be compressed, the compression scheme first compresses the block with the standard BC4 algorithm. It then estimates the error of the lossy compression of that block compared to the same block in the original (non-compressed) texture. Let us call that error $e_1$.

Next, the compression scheme needs to compress the same block using the auxiliary block compression scheme of FIG. 7. A new error $e_2$ is computed from the block in the original texture and from the representation created using the auxiliary block compression scheme.

If $e_1 \leq e_2$, the standard BC4 algorithm performed better than the smooth interpolation scheme from the auxiliary processing mode, and vice versa. So, if $e_1 \leq e_2$, we store the parameters for BC4 in such a way that it does not indicate a redundant bit combination. However, if $e_1 > e_2$, we need to indicate that the compression parameters will be stored using the redundant bit combinations. This is done using the technique for extracting the redundant bits.

Decompression

For decompression, we again describe what happens to a single block. First, we check whether $c_0$ and $c_1$ indicate that a redundant bit combination is used for that block. If this is so, then parameters are extracted using the embodiments for extraction disclosed above. Then the colors of the block are reconstructed using the auxiliary block compression scheme. If $c_0$ and $c_1$ indicate that a redundant bit combination is not used, then BC4 decompression happens as usual.

Figure 8:
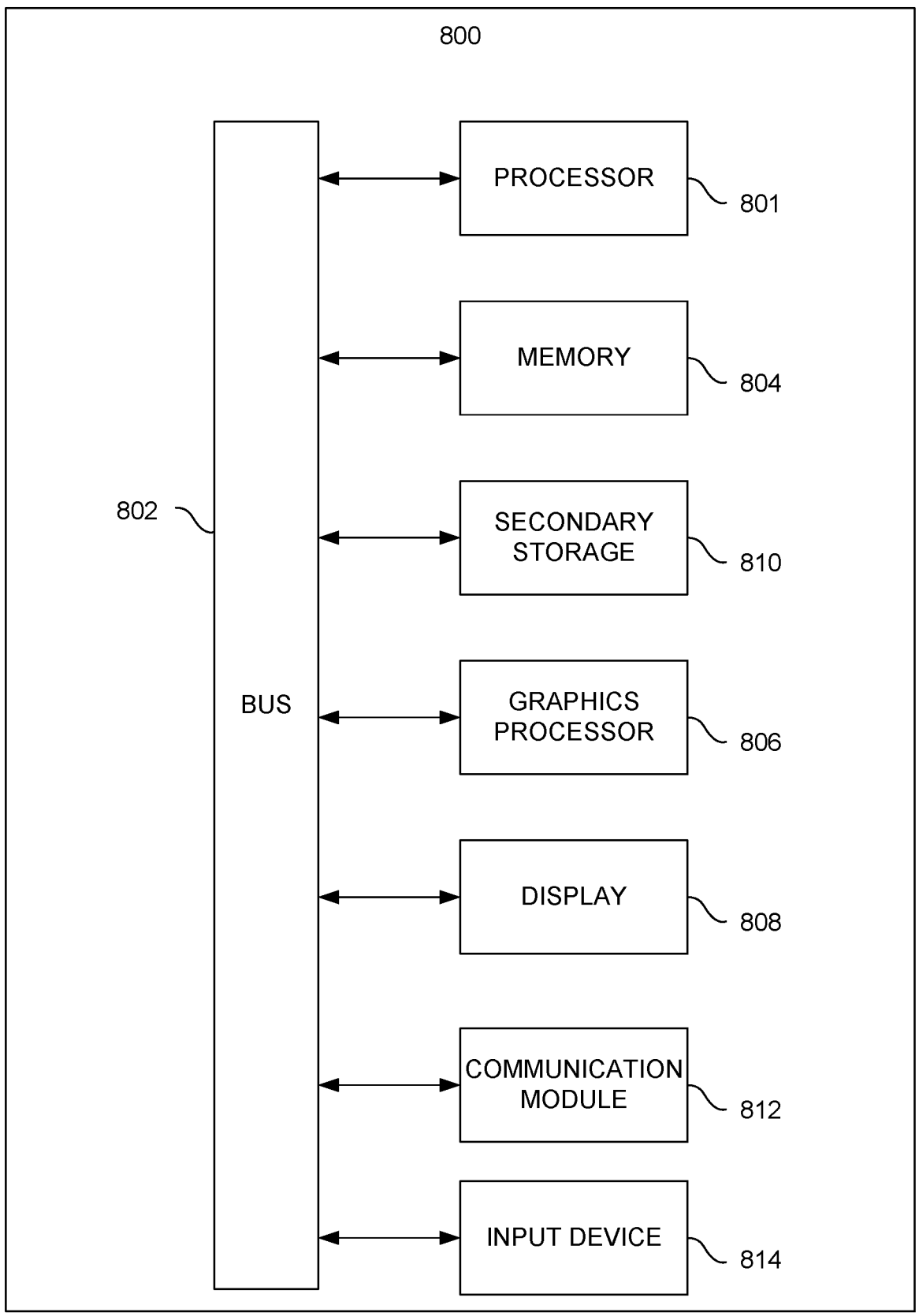
FIG. 8 illustrates an exemplary computing system, in accordance with an embodiment.

FIG. 8 illustrates an exemplary computing system 800, in accordance with an embodiment. One or more of the components shown in system 800 may be implemented within the messaging devices and switches described herein, such that the hardware and software of the messaging devices and switches are configured to enable the messaging devices and switches to function in accordance with the embodiments described.

As shown, the system 800 includes at least one central processor 801 which is connected to a communication bus 802. The system 800 also includes main memory 804 [e.g. random access memory (RAM), etc.]. The system 800 also includes a graphics processor 806 and a display 808.

The system 800 may also include a secondary storage 810. The secondary storage 810 includes, for example, a hard disk drive and/or a removable storage drive, representing a floppy disk drive, a magnetic tape drive, a compact disk drive, a flash drive or other flash storage, etc. The removable storage drive reads from and/or writes to a removable storage unit in a well-known manner.

Computer programs, or computer control logic algorithms, may be stored in the main memory 804, the secondary storage 810, and/or any other memory, for that matter. Such computer programs, when executed, enable the system 800 to perform various functions, including for example sending, receiving, and/or processing messages in accordance with the epoch-based messaging protocol. Memory 804, storage 810 and/or any other storage are possible examples of non-transitory computer-readable media.

The system 800 may also include one or more communication modules 812. The communication module 812 may be operable to facilitate communication between the system 800 and one or more networks, and/or with one or more devices (e.g. game consoles, personal computers, servers etc.) through a variety of possible standard or proprietary wired or wireless communication protocols (e.g. via Bluetooth, Near Field Communication (NFC), Cellular communication, etc.).

As also shown, the system 800 may include one or more input devices 814. The input devices 814 may be a wired or wireless input device. In various embodiments, each input device 814 may include a keyboard, touch pad, touch screen, game controller, remote controller, or any other device capable of being used by a user to provide input to the system 800.

While various embodiments have been described above, it should be understood that they have been presented by way of example only, and not limitation. Thus, the breadth and scope of a preferred embodiment should not be limited by any of the above-described exemplary embodiments, but should be defined only in accordance with the following claims and their equivalents.

What is claimed is:

1. A method comprising:
at a device:
compressing a block of an image using a default block compression scheme to generate a first compressed representation of the block, the default block compression scheme configured to generate a compressed representation of a given block that includes a first set of bits representing a first value and a second set of bits representing a second value;
computing a first error for the first compressed representation of the block;
compressing the block of the image using an auxiliary block compression scheme to generate a second compressed representation of the block, the auxiliary block compression scheme configured to exploit a plurality of redundant bit combinations supported by the default block compression scheme, each redundant bit combination of the plurality of redundant bit combinations occurring when a difference between the first set of bits in the compressed representation and the second set of bits in the compressed representation is between 0 and a defined threshold, wherein the defined threshold is greater than 0;
computing a second error for the second compressed representation of the block;
selecting between the first compressed representation of the block and the second compressed representation of the block, based on the first error and the second error, to result in a selected compressed representation of the block; and
storing the selected compressed representation of the block in a compressed representation of the image;

wherein the auxiliary block compression scheme is configured by:
detecting the plurality of redundant bit combinations in two subsets including a first subset of redundant bit combinations where $c1-c0<=2^n-2$ and $c0<2^m-(2^n-2)$ and a second subset of redundant bit combinations where $c0>=2^m-(2^n-2)$, where c0 is the first set of bits, c1 is the second set of bits, m is a number of bits in the first value and the second value, and n is a number of per-pixel index bits,
enumerating the redundant bit combinations in the first subset of redundant bit combinations and the redundant bit combinations in the second subset of redundant bit combinations,
computing a number of the plurality of redundant bit combinations supported by the default block compression scheme based on the enumerating,
configuring the auxiliary block compression scheme to use the number when generating the second compressed representation of the block.

2. The method of claim 1, wherein the image includes a plurality of blocks and wherein each block of the plurality of blocks corresponds with a portion of the image that includes a plurality of pixels each having a corresponding color value.

3. The method of claim 1, wherein the first value is a first color value and the second value is a second color value.

4. The method of claim 3, wherein the first color value and the second color value are grayscale values.

5. The method of claim 3, wherein the first color value and the second color value are red, green, blue (RGB) values.

6. The method of claim 1, wherein the default block compression scheme is one of BC1 through BC7.

7. The method of claim 1, wherein the defined threshold is selected based on parameters of the default block compression scheme, the parameters including:
a number of bits used for each of the first set of bits and the second set of bits, and a number of bits used for each image element index.

8. The method of claim 1, wherein the defined threshold is selected to ensure that every bit combination supported by the default block compression scheme and having two or more repeated values among the first value, the second value, and their interpolated values is identified as a redundant bit combination.

9. The method of claim 1, wherein the auxiliary block compression scheme is configured to use the number for encoding higher quality image data.

10. The method of claim 9, wherein the auxiliary block compression scheme is configured to use the number to store a high resolution color value (c), a delta color value (d), and an indicator per pixel that selects between (c) and (d).

11. The method of claim 9, wherein the auxiliary block compression scheme is configured to use the number to provide a smooth interpolation.

12. The method of claim 11, wherein the auxiliary block compression scheme is configured to use the number to store values at each corner pixel of four corner pixels of a given block, wherein values of remaining pixels in the given block are interpolated based on the stored four corner pixel values.

13. The method of claim 11, wherein the auxiliary block compression scheme is configured to use the number to store values including:
a first set of values for four corner pixels of a given block,
delta values for corner pair values per outer edge of the given block, and
a middle point value computed from the delta values,
wherein values of remaining pixels in the given block are interpolated based on the stored values.

14. The method of claim 1, wherein the first error and the second error are compression errors.

15. The method of claim 14, wherein:
the first error is computed by comparing the block to a first decompressed representation of the block resulting from decompression of the first compressed representation of the block; and
the second error is computed by comparing the block to a second decompressed representation of the block resulting from decompression of the second compressed representation of the block.

16. The method of claim 1, wherein selecting between the first compressed representation of the block and the second compressed representation of the block, based on the first error and the second error, to result in the selected compressed representation of the block includes:
selecting the first compressed representation of the block when the first error is less than the second error; and
selecting the second compressed representation of the block when the second error is less than or equal to the first error.

17. The method of claim 1, wherein the method is repeated for each of a plurality of additional blocks of the image.

18. The method of claim 1, wherein an auxiliary processing mode that includes the auxiliary block compression scheme and a corresponding auxiliary block decompression scheme is configured to support accelerated rendering for rasterization and ray tracing.

19. The method of claim 1, wherein an auxiliary processing mode that includes the auxiliary block compression scheme and a corresponding auxiliary block decompression scheme is configured to be used for rendering in a three-dimensional (3D) simulation platform.

20. The method of claim 1, wherein an auxiliary processing mode that includes the auxiliary block compression scheme and a corresponding auxiliary block decompression scheme is configured to be used for real-time rendering.

21. The method of claim 1, wherein an auxiliary processing mode that includes the auxiliary block compression scheme and a corresponding auxiliary block decompression scheme is configured to be used for offline rendering.

22. The method of claim 1, wherein an auxiliary processing mode that includes the auxiliary block compression scheme and a corresponding auxiliary block decompression scheme is configured to be used for rendering used in a car simulation.

23. The method of claim 1, wherein an auxiliary processing mode that includes the auxiliary block compression scheme and a corresponding auxiliary block decompression scheme is configured to be used for rendering of a physical simulation that uses textures.

24. The method of claim 1, wherein an auxiliary processing mode that includes the auxiliary block compression scheme and a corresponding auxiliary block decompression scheme is configured to be used for a system that uses texture for deep learning.

25. The method of claim 1, wherein plurality of redundant bit combinations supported by the default block compression scheme that the auxiliary block compression scheme is configured to exploit include at least one redundant bit combination in which a difference between the first set of bits in the compressed representation and the second set of bits in the compressed representation is greater than 0 and within the defined threshold.

26. A system, comprising:
    a non-transitory memory storage of a receiving device comprising instructions; and
    one or more processors of the receiving device in communication with the memory, wherein the one or more processors execute the instructions to:
    compress a block of an image using a default block compression scheme to generate a first compressed representation of the block, the default block compression scheme configured to generate a compressed representation of a given block that includes a first set of bits representing a first value and a second set of bits representing a second value;
    compute a first error for the first compressed representation of the block;
    compress the block of the image using an auxiliary block compression scheme to generate a second compressed representation of the block, the auxiliary block compression scheme configured to exploit a plurality of redundant bit combinations supported by the default block compression scheme, each redundant bit combination of the plurality of redundant bit combinations occurring when a difference between the first set of bits in the compressed representation and the second set of bits in the compressed representation is between 0 and a defined threshold, wherein the defined threshold is greater than 0;
    compute a second error for the second compressed representation of the block;
    select between the first compressed representation of the block and the second compressed representation of the block, based on the first error and the second error, to result in a selected compressed representation of the block; and
    store the selected compressed representation of the block in a compressed representation of the image;
    wherein the auxiliary block compression scheme is configured by:
    detecting the plurality of redundant bit combinations in two subsets including a first subset of redundant bit combinations where $c1-c0<=2^n-2$ and $c0<2^m-(2^n-2)$ and a second subset of redundant bit combinations where $c0>=2^m-(2^n-2)$, where c0 is the first set of bits, c1 is the second set of bits, m is a number of bits in the first value and the second value, and n is a number of per-pixel index bits,
    enumerating the redundant bit combinations in the first subset of redundant bit combinations and the redundant bit combinations in the second subset of redundant bit combinations,
    computing a number of the plurality of redundant bit combinations supported by the default block compression scheme based on the enumerating,
    configuring the auxiliary block compression scheme to use the number when generating the second compressed representation of the block.

27. A non-transitory computer-readable media storing computer instructions which when executed by one or more processors of a receiving device cause the receiving device to:
    compress a block of an image using a default block compression scheme to generate a first compressed representation of the block, the default block compression scheme configured to generate a compressed representation of a given block that includes a first set of bits representing a first value and a second set of bits representing a second value;
    compute a first error for the first compressed representation of the block;
    compress the block of the image using an auxiliary block compression scheme to generate a second compressed representation of the block, the auxiliary block compression scheme configured to exploit a plurality of redundant bit combinations supported by the default block compression scheme, each redundant bit combination of the plurality of redundant bit combinations occurring when a difference between the first set of bits in the compressed representation and the second set of bits in the compressed representation is between 0 and a defined threshold, wherein the defined threshold is greater than 0;
    compute a second error for the second compressed representation of the block;
    select between the first compressed representation of the block and the second compressed representation of the block, based on the first error and the second error, to result in a selected compressed representation of the block; and
    store the selected compressed representation of the block in a compressed representation of the image;
    wherein the auxiliary block compression scheme is configured by:
    detecting the plurality of redundant bit combinations in two subsets including a first subset of redundant bit combinations where $c1-c0<=2^n-2$ and $c0<2^m-(2^n-2)$ and a second subset of redundant bit combinations where $c0>=2^m-(2^n-2)$, where c0 is the first set of bits, c1 is the second set of bits, m is a number of bits in the first value and the second value, and n is a number of per-pixel index bits,
    enumerating the redundant bit combinations in the first subset of redundant bit combinations and the redundant bit combinations in the second subset of redundant bit combinations,
    computing a number of the plurality of redundant bit combinations supported by the default block compression scheme based on the enumerating,
    configuring the auxiliary block compression scheme to use the number when generating the second compressed representation of the block.

28. A method, comprising:
    at a device:
    selecting, for decompression, a compressed representation of a block of an image stored in a compressed representation of the image;
    determining, from bits in the compressed representation of the block, which block compression scheme was used to create the compressed representation of the block, the block compression scheme being determined from among:
        a default block compression scheme configured to generate a particular compressed representation of a given block that includes a first set of bits representing a first value and a second set of bits representing a second value, and
        an auxiliary block compression scheme configured to exploit a plurality of redundant bit combinations supported by the default block compression scheme, each redundant bit combination of the plurality of redundant bit combinations occurring when a difference between the first set of bits in the particular compressed representation and the second set of bits in the particular compressed representation is between 0 and a defined threshold, wherein the defined threshold is greater than 0; and decompressing the compressed representation of the block using a block decompression scheme corresponding to the determined block compression scheme;

wherein the auxiliary block compression scheme is configured by:

detecting the plurality of redundant bit combinations in two subsets including a first subset of redundant bit combinations where $c1-c0<=2^n-2$ and $c0<2^m-(2^n-2)$ and a second subset of redundant bit combinations where $c0>=2^m-(2^n-2)$, where $c0$ is the first set of bits, $c1$ is the second set of bits, $m$ is a number of bits in the first value and the second value, and $n$ is a number of per-pixel index bits, enumerating the redundant bit combinations in the first subset of redundant bit combinations and the redundant bit combinations in the second subset of redundant bit combinations, computing a number of the plurality of redundant bit combinations supported by the default block compression scheme based on the enumerating, configuring the auxiliary block compression scheme to use the number when generating the second compressed representation of the block.

29. The method of claim 28, wherein determining, from bits in the compressed representation of the block, which block compression scheme was used to create the compressed representation of the block includes:

determining that the auxiliary block compression scheme was used to create the compressed representation of the block when the bits in the compressed representation indicate the auxiliary block compression scheme, otherwise, determining that the default block compression scheme was used to create the compressed representation of the block.

30. The method of claim 28, wherein the bits in the compressed representation of the block that are used to determine which block compression scheme was used to create the compressed representation of the block include a bit set comprised of the first set of bits representing the first value and the second set of bits representing the second value.

31. The method of claim 28, wherein the decompression is performed for at least one of:

accelerated rendering for rasterization and ray tracing, rendering in a three-dimensional (3D) simulation platform, real-time rendering, offline rendering, rendering used in car simulation, rendering of a physical simulation that uses textures, or a system that uses texture for deep learning.

* * * * *